United States Patent
Cermak et al.

(10) Patent No.: US 11,143,548 B2
(45) Date of Patent: Oct. 12, 2021

(54) SIMULTANEOUS OSCILLATION AND FREQUENCY TRACKING OF MULTIPLE RESONANCES VIA DIGITALLY IMPLEMENTED PHASE-LOCKED LOOP ARRAY

(71) Applicant: Massachusetts Institute of Technology, Cambridge, MA (US)

(72) Inventors: Nathan Cermak, Cambridge, MA (US); Selim Olcum, Cambridge, MA (US); Steven Charles Wasserman, Concord, MA (US); Scott R. Manalis, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/523,033

(22) PCT Filed: Oct. 27, 2015

(86) PCT No.: PCT/US2015/057634
§ 371 (c)(1),
(2) Date: Apr. 28, 2017

(87) PCT Pub. No.: WO2016/069634
PCT Pub. Date: May 6, 2016

(65) Prior Publication Data
US 2018/0245972 A1    Aug. 30, 2018

Related U.S. Application Data

(60) Provisional application No. 62/069,793, filed on Oct. 28, 2014.

(51) Int. Cl.
*G01H 13/00*    (2006.01)
*G01N 5/02*    (2006.01)
(Continued)

(52) U.S. Cl.
CPC ............... *G01H 13/00* (2013.01); *G01N 5/02* (2013.01); *G01N 9/002* (2013.01); *H03L 7/00* (2013.01);
(Continued)

(58) Field of Classification Search
CPC .... G01N 5/02; G01N 9/002; G01N 2009/004; G01N 2009/006; G01H 13/00; H03L 7/0805
(Continued)

(56) References Cited

U.S. PATENT DOCUMENTS 7,215,214 B1    5/2007    Taheri et al.
7,387,889 B2    6/2008    Manalis
(Continued)

FOREIGN PATENT DOCUMENTS

FR    2996219 A1    4/2014
JP    2007-506977 A    3/2007
(Continued)

OTHER PUBLICATIONS

International Search Report and Written Opinion dated Jun. 8, 2018 for Application No. PCT/US2018/025040.
(Continued)

*Primary Examiner* — Benjamin R Schmitt
(74) *Attorney, Agent, or Firm* — Wolf, Greenfield & Sacks, P.C.

(57) ABSTRACT

Systems and Methods for controlling one or more mechanical resonators and determining information from resonant shift of the resonator(s) behavior, including at least one mechanical resonator, an excitation element for driving the resonator(s), a sensor for monitoring the motion of the resonator(s), at least one phase locked loop (PLL) in feedback between the excitation and monitoring elements, wherein each PLL is configured to operate at or near a
(Continued)

different resonant mode of the resonator(s), and a processor for determining information from PLL internal signals indicative of a resonator frequency shift.

20 Claims, 9 Drawing Sheets

(51) Int. Cl.
  *H03L 7/00* (2006.01)
  *H03L 7/08* (2006.01)
  *G01N 9/00* (2006.01)
(52) U.S. Cl.
  CPC ...... *H03L 7/0805* (2013.01); *G01N 2009/004* (2013.01); *G01N 2009/006* (2013.01)
(58) Field of Classification Search
  USPC .............................................. 73/24.01, 24.06
  See application file for complete search history.

(56) References Cited

U.S. PATENT DOCUMENTS

| | | |
|---|---|---|
| 7,449,968 B1 | 11/2008 | Cioffi et al. |
| 7,812,680 B1 | 10/2010 | Brown et al. |
| 7,838,284 B2 | 11/2010 | Manalis |
| 8,087,284 B2 | 1/2012 | Babcock et al. |
| 8,291,750 B1 | 10/2012 | Goodbread et al. |
| 8,722,419 B2 | 5/2014 | Manalis et al. |
| 9,027,388 B2 | 5/2015 | Babcock et al. |
| 9,134,294 B2 | 9/2015 | Manalis et al. |
| 9,134,295 B1 | 9/2015 | Delgado et al. |
| 9,347,815 B2 | 5/2016 | Roukes et al. |
| 9,515,608 B2 | 12/2016 | Gourlat et al. |
| 9,709,400 B2 | 7/2017 | Kapusta |
| 9,757,727 B2 | 9/2017 | Manalis et al. |
| 2003/0033876 A1 | 2/2003 | Roukes et al. |
| 2003/0176174 A1 | 9/2003 | Seppinen et al. |
| 2005/0064581 A1 | 3/2005 | Manalis et al. |
| 2005/0164236 A1 | 7/2005 | Su et al. |
| 2007/0176705 A1 | 8/2007 | Sutardja |
| 2007/0178529 A1 | 8/2007 | Breidford et al. |
| 2009/0014360 A1 | 1/2009 | Toner et al. |
| 2009/0044608 A1 | 2/2009 | Babcock et al. |
| 2009/0053749 A1 | 2/2009 | Manalis et al. |
| 2009/0261241 A1 | 10/2009 | Roukes et al. |
| 2010/0154535 A1 | 6/2010 | Manalis et al. |
| 2010/0263445 A1 | 10/2010 | Hayner et al. |
| 2010/0315138 A1 | 12/2010 | Namba et al. |
| 2011/0113856 A1 | 5/2011 | Cobianu et al. |
| 2011/0271412 A1 | 11/2011 | Rychen |
| 2014/0013848 A1 | 1/2014 | Colinet et al. |
| 2014/0156224 A1 | 6/2014 | Roukes et al. |
| 2014/0306623 A1 | 10/2014 | Caffee et al. |
| 2014/0312980 A1 | 10/2014 | Villard et al. |
| 2015/0300999 A1 | 10/2015 | Andreucci et al. |
| 2015/0308990 A1 | 10/2015 | Andreucci et al. |
| 2015/0343444 A1 | 12/2015 | Manalis et al. |
| 2016/0091544 A1 | 3/2016 | Daneshmand et al. |
| 2016/0123858 A1 | 5/2016 | Kapur et al. |
| 2016/0181977 A1 | 6/2016 | Gourlat et al. |
| 2017/0117905 A1 | 4/2017 | Cermak et al. |
| 2018/0207639 A1 | 7/2018 | Butler et al. |
| 2018/0299362 A1 | 10/2018 | Kimmerling et al. |

FOREIGN PATENT DOCUMENTS

| | | | |
|---|---|---|---|
| JP | 2013-543127 A | | 11/2013 |
| JP | 2014-006211 A | | 1/2014 |
| JP | 2014-510921 A | | 5/2014 |
| WO | WO 2012/059828 A2 | | 5/2012 |
| WO | WO 2015/155044 A1 | | 10/2015 |
| WO | WO 2018/236708 A1 | | 12/2018 |

OTHER PUBLICATIONS

International Search Report and Written Opinion dated Aug. 27, 2018 for Application No. PCT/US2018/037995.
Ananthakrishnan et al., Quantifying the contribution of actin networks to the elastic strength of fibroblasts. J Theor Biol. Sep. 21, 2006;242(2):502-16. Epub May 23, 2006.
Bagnall et al., Deformability-based cell selection with downstream immunofluorescence analysis. Integr Biol (Camb). May 16, 2016;8(5):654-64. doi: 10.1039/c5ib00284b. Epub Mar. 11, 2016.
Balland et al., Power laws in microrheology experiments on living cells: Comparative analysis and modeling. Phys Rev E Stat Nonlin Soft Matter Phys. Aug. 2006;74(2 Pt 1):021911(1-17). Epub Aug. 9, 2006.
Brangwynne et al., Force fluctuations and polymerization dynamics of intracellular microtubules. Proc Natl Acad Sci U S A. Oct. 9, 2007;104(41):16128-33. Epub Oct. 2, 2007.
Bremer et al., Modulation of chemical composition and other parameters of the cell at different exponential growth rates. EcoSal Plus. Sep. 2008;3(1):(1-49). doi: 10.1128/ecosal.5.2.3.
Bruus, Acoustofluidics 1: Governing equations in microfluidics. Lab Chip. Nov. 21, 2011;11(22):3742-51. doi: 10.1039/c11c20658c. Epub Oct. 20, 2011.
Bryan et al., Measurement of mass, density, and volume during the cell cycle of yeast. Proc Natl Acad Sci U S A. Jan. 19, 2010;107(3):999-1004. doi: 10.1073/pnas.0901851107. Epub Dec. 23, 2009.
Burg et al., Nonmonotonic energy dissipation in microfluidic resonators. Phys Rev Lett. Jun. 5, 2009;102(22):228103(1-4). Epub Jun. 4, 2009.
Butzin et al., Analysis of the effects of a gerP mutation on the germination of spores of Bacillus subtilis. J Bacteriol. Nov. 2012;194(21):5749-58. doi: 10.1128/JB.01276-12. Epub Aug. 17, 2012.
Byun et al., Characterizing cellular biophysical responses to stress by relating density, deformability, and size. Biophys J. Oct. 20, 2015;109(8):1565-73. doi: 10.1016/j.bpj.2015.08.038.
Byun et al., Characterizing deformability and surface friction of cancer cells. Proc Natl Acad Sci U S A. May 7, 2013;110(19):7580-5. doi: 10.1073/pnas.1218806110. Epub Apr. 22, 2013.
Cartagena-Rivera et al., Actomyosin cortical mechanical properties in nonadherent cells determined by atomic force microscopy. Biophys J. Jun. 7, 2016;110(11):2528-2539. doi: 10.1016/j.bpj.2016.04.034.
Cermak et al., Direct single-cell biomass estimates for marine bacteria via Archimedes' principle. ISME J. Mar. 2017;11(3):825-828. doi: 10.1038/ismej.2016.161. Epub Dec. 6, 2016.
Cermak et al., High-throughput measurement of single-cell growth rates using serial microfluidic mass sensor arrays. Nat Biotechnol. Oct. 2016;34(10):1052-1059. doi: 10.1038/nbt.3666. Epub Sep. 5, 2016.
Cetin et al., Determining therapeutic susceptibility in multiple myeloma by single-cell mass accumulation. Nat Commun. Nov. 20, 2017;8(1):1613(1-12). doi: 10.1038/s41467-017-01593-2.
Chugh et al., Actin cortex architecture regulates cell surface tension. Nat Cell Biol. Jun. 2017;19(6):689-697. Suppl Info 19 pages. doi: 10.1038/ncb3525. Epub May 22, 2017.
Clark et al., Monitoring actin cortex thickness in live cells. Biophys J. Aug. 6, 2013;105(3):570-80. doi: 10.1016/j.bpj.2013.05.057.
Delgado et al., Intracellular water exchange for measuring the dry mass, water mass and changes in chemical composition of living cells. PLoS One. Jul. 2013;8(7):e67590(1-11).
Dendukuri et al., Continuous-flow lithography for high-throughput microparticle synthesis. Nat Mater. May 2006;5(5):365-9. Epub Apr. 9, 2006.
Dendukuri et al., Stop-flow lithography in a microfluidic device. Lab Chip. Jul. 2007;7(7):818-28. Epub May 21, 2007.
Di Carlo et al, Continuous inertial focusing, ordering, and separation of particles in microchannels. Proc Natl Acad Sci. Nov. 27, 2007;104(48):18892-7.
Fischer-Friedrich et al., Rheology of the active cell cortex in mitosis. Biophys J. Aug. 9, 2016;111(3):589-600. doi: 10.1016/j.bpj.2016.06.008.
Gardel et al., Mechanical integration of actin and adhesion dynamics in cell migration. Annu Rev Cell Dev Biol. 2010;26:315-33. doi: 10.1146/annurev.cellbio.011209.122036. Epub May 17, 2010.

(56) References Cited

OTHER PUBLICATIONS

Georgatos et al., Nuclear envelope breakdown in mammalian cells involves stepwise lamina disassembly and microtubule-drive deformation of the nuclear membrane. J Cell Sci. Sep. 1997;110( Pt 17):2129-40.
Gerhardt et al., Permeability of bacterial spores. II. Molecular variables affecting solute permeation. J Bacteriol. Nov. 1961;82:750-60.
Godin et al., Using buoyant mass to measure the growth of single cells. Nat Methods. May 2010;7(5):387-90. Suppl Info 2 pages. doi: 10.1038/nmeth.1452. Epub Apr. 11, 2010.
Gossett et al., Hydrodynamic stretching of single cells for large population mechanical phenotyping. Proc Natl Acad Sci U S A. May 15, 2012;109(20):7630-5. doi: 10.1073/pnas.1200107109. Epub Apr. 30, 2012.
Grover et al., Measuring single-cell density. Proc Natl Acad Sci U S A. Jul. 5, 2011;108(27):10992-6. doi: 10.1073/pnas.1104651108. Epub Jun. 20, 2011. Early Edition, 5 pages.
Guillou et al., Dynamic monitoring of cell mechanical properties using profile microindentation. Sci Rep. Feb. 9, 2016;6:21529(1-13). doi: 10.1038/srep21529.
Guo et al., Cell volume change through water efflux impacts cell stiffness and stem cell fate. Proc Natl Acad Sci U S A. Oct. 10, 2017;114(41):E8618-E8627. doi: 10.1073/pnas.1705179114. Epub Sep. 25, 2017. Early Edition, 10 pages.
Gupta et al., Equilibrium and out-of-equilibrium mechanics of living mammalian cytoplasm. J Mechan Phys Solids. 2017;107:284-93. Epub Jul. 8, 2017.
Hartono et al., On-chip measurements of cell compressibility via acoustic radiation. Lab Chip. Dec. 7, 2011;11(23):4072-80. Epub Oct. 21, 2011.
Henderson et al., Actin filament dynamics in living glial cells imaged by atomic force microscopy. Science. Sep. 25, 1992;257(5078):1944-6.
Hiramoto et al., Mechanical properties of the surface of the sea urchin egg at fertilization and during cleavage. Exp Cell Res. Dec. 1974;89(2):320-6.
Ivanova et al., Bactericidal activity of black silicon. Nat Commun. 2013;4:2838(1-7). doi: 10.1038/ncomms3838. Epub Nov. 26, 2013.
Jin et al., A microfluidic device enabling high-efficiency single cell trapping. Biomicrofluidics. Jan. 7, 2015;9:014101(1-16).
Khalili et al., A microfluidic device for hydrodynamic trapping and manipulation platform of a single biological cell. Appl Sci. Feb. 1, 2016;6(40):1-17.
Kimmerling et al., A microfluidic platform enabling single-cell RNA-seq of multigenerational lineages. Nat Commun. Jan. 6, 2016;7:10220(1-7). doi: 10.1038/ncomms10220. Epub Jan. 6, 2016.
Kimmerling, A toolset for linking phenotype and gene expression at the single-cell level. Doctoral Thesis—Massachusetts Institute of Technology. Feb. 2017. 142 pages.
Knudsen et al., Water and small-molecule permeation of dormant Bacillus subtilis spores. J Bacteriol. Jan. 2016;198(1):168-77. doi: 10.1128/JB.00435-15. Epub Oct. 19, 2015.
Kundu et al., Measuring elastic properties of cells by evaluation of scanning acoustic microscopy V(Z) values using simplex algorithm. Biophys J. May 1991;59(6):1194-207.
Lim et al., Mechanical models for living cells—a review. J Biomech. 2006;39(2):195-216.
Lincoln et al., High-throughput rheological measurements with an optical stretcher. Methods Cell Biol. 2007;83:397-423.
Matzke et al., Direct, high-resolution measurement of furrow stiffening during division of adherent cells. Nat Cell Biol. Jun. 2001;3(6):607-10.
Narayanamurthy et al., Microfluidic hydrodynamic trapping for single cell analysis: mechanisms, methods and applications. Anal Methods. May 12, 2017;9:3751-72. doi: 10.1039/c7ay00656j.
Otto et al., Real-time deformability cytometry: on-the-fly cell mechanical phenotyping. Nat Methods. Mar. 2015;12(3):199-202, 4 p following 202. doi: 10.1038/nmeth.3281. Epub Feb. 2, 2015.

Ou-Yang et al, Complex fluids: Probing mechanical properties of biological systems with optical tweezers. Annu Rev Phys Chem. 2010;61:421-40. doi: 10.1146/annurev.physchem.012809.103454. Epub Jan. 4, 2010.
Paluch et al., Biology and physics of cell shape changes in development. Curr Biol. Sep. 15, 2009;19(17):R790-9. doi: 10.1016/j.cub.2009.07.029.
Plomp et al., Architecture and assembly of the Bacillus subtilis spore coat. PLoS One. Sep. 26, 2014;9(9):e108560(1-16). doi: 10.1371/journal.pone.0108560. eCollection 2014.
Pritchard et al., The role of F-actin in hypo-osmotically induced cell volume change and calcium signaling in anulus fibrosus cells. Ann Biomed Eng. Jan. 2004;32(1):103-11.
Radmacher, Studying the mechanics of cellular processes by atomic force microscopy. Methods Cell Biol. 2007;83:347-72.
Ramanathan et al., Cdk1-dependent mitotic enrichment of cortical myosin II promotes cell rounding against confinement. Nat Cell Biol. Feb. 2015;17(2):148-59. Suppl Info 10 pages. doi: 10.1038/ncb3098. Epub Jan. 26, 2015.
Riedl, et al., Lifeact: a versatile marker to visualize F-actin. Nat Methods. Jul. 2008;5(7):605-7. doi: 10.1038/nmeth.1220. Epub Jun. 8, 2008.
Rinke et al., Obtaining genomes from uncultivated environmental microorganisms using FACS-based single-cell genomics. Nat Protoc. May 2014;9(5):1038-48. doi: 10.1038/nprot.2014.067. Epub Apr. 10, 2014.
Rodrigues et al., Kinetochore-localized PP1-Sds22 couples chromosome segregation to polar relaxation. Nature. Aug. 27, 2015;524(7566):489-92. Suppl Info 18 pages. doi: 10.1038/nature14496. Epub Jul. 13, 2015.
Sader et al., Energy dissipation in microfluidic beam resonators: Effect of Poisson's ratio. Phys Rev E Stat Nonlin Soft Matter Phys. Aug. 2011;84(2 Pt 2):026304(1-15). Epub Aug. 5, 2011.
Sader et al., Energy dissipation in microfluidic beam resonators: Dependence on mode number. J Appl Phys. Dec. 1, 2010;108(11):114507(1-14). Epub Dec. 9, 2010.
Scherrer et al., Density, porosity, and structure of dried cell walls isolated from Bacillus megaterium and *Saccharomyces cerevisiae*. J Bacteriol. Feb. 1977;129(2):1162-4.
Scherrer et al., Porosity of the yeast cell wall and membrane. J Bacteriol. May 1974;118(2):534-40.
Scherrer et al., Macromolecular sieving by the dormant spore of Bacillus cereus. J Bacteriol. Nov. 1971;108(2):868-73.
Son et al., Direct observation of mammalian cell growth and size regulation. Nat Methods. Sep. 2012;9(9):910-2. doi: Suppl Info 1 page. 10.1038/nmeth.2133. Epub Aug. 5, 2012.
Son et al., Resonant microchannel volume and mass measurements show that suspended cells swell during mitosis. J Cell Biol. Nov. 23, 2015;211(4):757-63. doi: 10.1083/jcb.201505058.
Steltenkamp et al., Membrane stiffness of animal cells challenged by osmotic stress. Small. Aug. 2006;2(8-9):1016-20.
Stevens et al., Drug sensitivity of single cancer cells is predicted by changes in mass accumulation rate. Nat Biotechnol. Nov. 2016;34(11):1161-1167. Suppl Info 2 pages. doi: 10.1038/nbt.3697. Epub Oct. 10, 2016.
Stewart et al., Hydrostatic pressure and the actomyosin cortex drive mitotic cell rounding. Nature. Jan. 13, 2011;469(7329):226-30. Suppl Info 1 page. doi: 10.1038/nature09642. Epub Jan. 2, 2011.
Swaminathan et al., Mechanical stiffness grades metastatic potential in patient tumor cells and in cancer cell lines. Cancer Res. Aug. 1, 2011;71(15):5075-80. Author Manuscript 18 pages. doi: 10.1158/0008-5472.CAN-11-0247. Epub Jun. 3, 2011.
Tseng et al., Micromechanical mapping of live cells by multiple-particle-tracking microrheology. Biophys J. Dec. 2002;83(6):3162-76.
Wang et al., Acoustophoretic force-based compressibility measurement of cancer cells having different metastatic potential. Proc Mtgs Acoust. Jun. 2013;19:045019(1-5).
Wang et al., Fast stiffness mapping of cells using high-bandwidth atomic force microscopy. ACS Nano. Jan. 26, 2016;10(1):257-64. doi: 10.1021/acsnano.5b03959. Epub Nov. 11, 2015.
Wang et al., Mechanotransduction across the cell surface and through the cytoskeleton. Science. May 21, 1993;260(5111):1124-7.

(56) References Cited

OTHER PUBLICATIONS

Yang et al., A comprehensive strategy for the analysis of acoustic compressibility and optical deformability on single cells. Sci Rep. Apr. 4, 2016;6:23946(1-11). doi: 10.1038/srep23946.
Yeung et al., Cortical shell-liquid core model for passive flow of liquid-like spherical cells into micropipets. Biophys J. Jul. 1989;56(1):139-49.
Zlotek-Zlotkiewicz et al., Optical volume and mass measurements show that mammalian cells swell during mitosis. J Cell Biol. Nov. 23, 2015;211(4):765-74. doi: 10.1083/jcb.201505056.
Albrecht et al., Frequency modulation detection using high-Q cantilevers for enhanced force microscope sensitivity. J Appl Phys. Jan. 15, 1991;69(2):668-73.
Atia et al., A phase-locked shear-force microscope for distance regulation in near-field optical microscopy. Appl Phys Lett. Jan. 27, 1997;70(4):405-7.
Bouloc et al., FPGA-based programmable digital PLL with very high frequency resolution. 2011 18$^{th}$ IEEE Intl Conf on Electronics, Circuits, and Systems. Dec. 11-14, 2011;370-3.
Bouloc et al., All digital control system for a novel high frequency force sensor in non contact atomic force microscopy, IEEE Sensors, Oct. 2012;2012:pp. 1-4. doi : 10.1109/ICSENS.2012.6411039.
Chaste et al., A nanomechanical mass sensor with yoctogram resolution. Nat Nanotechnol. May 2012;7(5):301-4. doi: 10/1038/nnano.2012.42. Epub Apr. 1, 2012.
Dohn et al., Position and mass determination of multiple particles using cantilever based mass sensors. Appl Phys Lett. 2010;97(4):044103(1-3). Epub Jul. 29, 2010.
Dohn et al., Mass and position determination of attached particles on cantilever based mass sensors. Rev Sci Instrum. Oct. 2007;78(10):103303(1-3). Epub Oct. 31, 2010.
Ekinci et al., Ultimate limits to inertial mass sensing based upon nanoelectromechanical systems. J Appl Phys. Mar. 1, 2004;95(5):2682-9.
Gavartin et al., Stabilization of a linear nanomechanical oscillator to its thermodynamic limit. Nat Commun. 2013;4:2860(1-8). doi: 10.1038/ncomms3860. Epub Dec. 11, 2013.
Hanay et al., Single-protein nanomechanical mass spectrometry in real time. Nat Nanotechnol. Sep. 2012;7(9):602-8. doi: 10.1038/nnano.2012.119. Epub Aug. 26, 2012.
Hogenauer, An economical class of digital filters for decimation and interpolation. IEEE Trans on Acoustics, Speech, and Signal Processing. Apr. 1981;29(2):155-62.
Kobayashi et al., Frequency noise in frequency modulation atomic force microscopy. Rev Sci Instrum. Apr. 2009;80(4):043708(1-8). doi: 10.1063/1.3120913. Epub Apr. 27, 2009.
Kouh et al., Room-temperature operation of a nanoelectromechanical resonator embedded in a phase-locked loop. Appl Phys Lett. 2005;87(11):113112(1-3). Epub Sep. 9, 2005.
Lee et al., Suspended micro channel resonators with piezoresistive sensors. The Royal Society of Chemistry, UK. Lab Chip. 2011;11:645-51. Epub Dec. 22, 2010.
Lee et al., Toward attogram mass measurements in solution with suspended nanochannel resonators. Nano Lett. Jul. 14, 2010;10(7):2537-42. doi: 10.1021/nl101107u. Epub Jun. 8, 2010.
Olcum et al., High-speed multiple-mode mass-sensing resolves dynamic nanoscale mass distributions. Nat Commun. 2015;6:7070(1-8). doi: 10/1038/ncomms8070. Epub May 12, 2015.
Olcum et al., Weighing nanoparticles in solution at the attogram scale. Proc Natl Acad Sci U S A. Jan. 28, 2014;111(4):1310-5. doi: 10.1073/pnas.1318602111. Epub Jan. 13, 2014.
International Search Report and Written Opinion dated Jan. 22, 2016 for Application No. PCT/US2015/057634.
International Preliminary Report on Patentability dated May 11, 2017 for Application No. PCT/US2015/057634.
Bryan et al., Measuring single cell mass, volume, and density with dual suspended microchannel resonators. Lab Chip. Feb. 7, 2014;14(3):569-576. doi: 10.1039/c3lc51022k. Pub. Dec. 2, 2013.
Burg et al., Weighing of biomolecules, single cells and single nanoparticles in fluid. Nature. Apr. 26, 2007;446(7139):1066-9.
Lee et al., High precision particle mass sensing using microchannel resonators in the second vibration mode. Rev of Sci Instruments. Feb. 17, 2011;82(2):023704(1-4).
Lee et al., Suspended microchannel resonators with piezoresistive sensors. Lab Chip. Feb. 21, 2011;11(4):645-51. doi: 10.1039/c01c00447b. Epub Dec. 22, 2010.
Sell et al., A digital PLL circuit for resonator sensors. Sensors and Actuators A. Feb. 26, 2011;172(1):69-74.
International Preliminary Report on Patentability dated Jan. 2, 2020 for Application No. PCT/US2018/037995.
International Preliminary Report on Patentability dated Oct. 10, 2019 for Application No. PCT/US2018/025040.
Dextras et al., Integrated measurement of the mass and surface charge of discrete microparticles using a suspended microchannel resonator. Anal Chem. May 8, 2009;81:4517-23.
Goldstein, Faculty profile: Scott Manalis. MIT BE Newsletter. 2014. 3 pages.

SIMULTANEOUS OSCILLATION AND FREQUENCY TRACKING OF MULTIPLE RESONANCES VIA DIGITALLY IMPLEMENTED PHASE-LOCKED LOOP ARRAY

CROSS-REFERENCE TO RELATED APPLICATIONS

This application is a National Stage Application under 35 U.S.C. § 371 of International Patent Application No. PCT/US2015/057634, filed on Oct. 27, 2015, entitled "SIMULTANEOUS OSCILLATION AND FREQUENCY TRACKING OF MULTIPLE RESONANCES VIA DIGITALLY IMPLEMENTED PHASE-LOCKED LOOP ARRAY," which claims the benefit of 35 U.S.C. § 119(e) to U.S. Provisional Application No. 62/069,793, filed Oct. 28, 2014, entitled "SIMULTANEOUS OSCILLATION AND TRACKING OF MULTIPLE RESONANCES VIA DIGITALLY," which are incorporated herein by reference in their entireties for all purposes.

GOVERNMENT SUPPORT

This invention was made with Government support under Grant No. OCE-1129359 awarded by the National Science Foundation, under Grant No. P30 CA014051 awarded by the National Institutes of Health, under Grant No. W81XWH-09-2-0001-218193 awarded by the U.S. Army Medical Research and Material Command, and under Contract No. W911NF-09-D-0001 awarded by the Army Research Office. The Government has certain rights in the invention.

TECHNICAL FIELD

This application relates to controlled oscillation of resonators and in particular to digitally implemented Phase-Locked Loop (PLL) control of Suspended MicroChannel Resonators (SMR's).

BACKGROUND

SMR's are developing uses in medical and industrial applications requiring the rapid characterization of substances suspended in fluids. Increased automation and high throughput requirements for some SMR applications may benefit from improved techniques for oscillation control and resonant shift detection for SMR's.

SUMMARY

In some embodiments a control system and methods for operating one or more SMR's includes a digitally implemented PLL operating as a feedback loop between the excitation and motion sensing elements of an SMR system allowing for precise and tailored control, of SMR oscillation and resonant shift detection.

In some embodiments, a system may be provided for controlling one or more mechanical resonators and determining information from the resonator(s) behavior, including at least one mechanical resonator, an excitation element for driving the resonator(s), a sensor for monitoring the motion of the resonator(s), at least one phase locked loop (PLL) in feedback between the excitation and monitoring elements, wherein each PLL is configured to operate at or near a different resonant mode of the resonator(s), and a processor for determining information from PLL internal signals indicative of a resonator frequency shift.

In some embodiments, a method may be provided for controlling one or more mechanical resonators and determining information from the resonator(s) behavior, including driving the resonator(s) with an excitation element, sensing the motion of the resonator(s), operating at least one phase locked loop (PLL) in feedback between the excitation and monitoring elements, wherein each PLL is configured to operate at or near a different resonant mode of the resonator(s), and determining information from PLL internal signals indicative of a resonator frequency shift.

In some embodiments, the PLL's may be implemented in digital logic.

In some embodiments, the PLL's may be implemented on a Field Programmable Gate Array (FPGA).

In some embodiments, the transfer function of each resonator-PLL feedback loop may be configurable for desired characteristics including shape and bandwidth.

In some embodiments, the system may be configured to determine a 1-dimensional mass distribution from a resonant shift due the presence of a carried substance on the resonator.

In some embodiments, an array of resonators may be operated together.

In some embodiments, the array size may be one of 1 or more resonators, 10 or more resonators, or 50 or more resonators.

In some embodiments, the resonant frequencies of the resonators may be separated by at least 2 kHz.

In some embodiments, the resonator frequency may be between 30 kHz and 10 MHz.

In some embodiments, the resonator dimensions range from 10 microns to 1000 microns in length and from 1 to 100 microns in cross section.

In some embodiments, the mechanical resonator may be a suspended resonator.

In some embodiments the suspended resonator may be at least one of a cantilever resonator with a fixed end and a free end or a membrane resonator with at least two attachment regions.

In some embodiments, the suspended resonator may carry a fluid channel.

In some embodiments the system may include fluidic control elements for flowing suspended particles in the fluid channel and the information determined from the resonant shift includes mass and position of the particles.

BRIEF DESCRIPTION OF THE DRAWINGS

Aspects and advantages of the embodiments provided herein are described with reference to the following detailed description in conjunction with the accompanying drawings. Throughout the drawings, reference numbers may be re-used to indicate correspondence between referenced elements. The drawings are provided to illustrate example embodiments described herein and are not intended to limit the scope of the disclosure.

DETAILED DESCRIPTION

Generally described, aspects of the present disclosure relate to resonators produced using fine scale microfabrication techniques for the structure, channels and in some cases actuators. Microfabrication may include patterning, etching, deposition, injection and related processes on such materials as glass, metals, plastics and crystalline materials such as silicon and silicon derivatives. Drivers, PLL's, and other elements may include electronic circuits made from electrical components including resistors, capacitors, transistors, logic elements and the like which also may be fabricated onto application specific circuits and/or made up of discrete components in any combination.

One or more embodiments described herein may provide well controlled actuation and detection arrays of resonators, enabling the design of high-throughput parallel or series measurement systems based on suspended resonator technology.

One or more embodiments described herein may provide for precise shaping of the control signals for suspended resonators.

Mechanical resonators carrying fluid channels, for some cases known as suspended micro or nano channel resonators (SMR, SNR, used interchangeable herein) may be desirable for measuring properties such as the mass of objects that pass through the resonator. Various fluid channel resonators are described in the incorporated references attached hereto. These devices generally may include a fluidic device in which objects pass along a resonator that is oscillating. As an object moves along the resonator, the resonant frequency changes, enabling the measurement of properties such as mass of the object. Such resonators may be used to analyze the properties of cells or other particles.

Micro- and nano-mechanical resonators are extremely sensitive to external perturbations such as weak forces, electrical or magnetic fields and mass changes due to their high quality factors and miniscule sizes. Monitoring the oscillation frequency of such a resonator in one or more vibrational modes is a technique for detecting and quantifying these tiny perturbations. Using multiple mechanical resonators on a single device or single resonators in multiple vibration modes provides improved throughput and/or added functionality for the measurements of interest. Arrays of resonators for measuring growth rates of cells are described in U.S. Pat. No. 9,134,295, commonly owned with this application, and incorporated by reference. A scalable, high precision technique with controllable bandwidth may be desirable for simultaneously oscillating and monitoring a large number of resonances.

Resonator systems in some cases may utilize self-excitation loops for operation. Self-excitation loops, where the motion of the resonator is amplified, delayed, and fed back as the excitation signal, keep the resonator oscillating at its resonant frequency at all times, and provide high bandwidth measurements. However, when applied to multiple resonances with a single summed output, e.g. multiple modes of a resonator; it may be difficult to optimize the phase-shift and vibration amplitude for the individual modes, which may be desirable for minimizing the noise and precisely measuring resonance frequencies. Therefore, achieving sustained oscillations at multiple resonances may require the detection of the motion of each resonance, independent processing of each resonance signal and simultaneous excitation of the resonances. This may be advantageous for either observing multiple resonant modes for a single resonator, or observing resonant modes from multiple resonators with common excitation, or a combination of the two.

Figure 1:
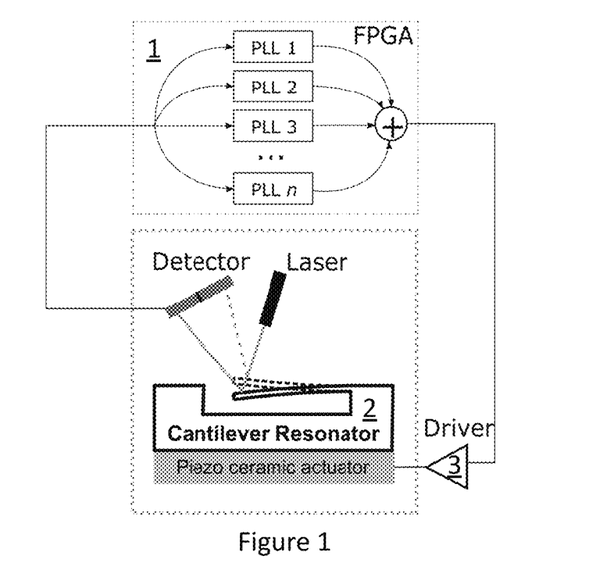
FIG. 1 shows a simplified schematic of an illustrative embodiment.

Controlling multiple modes may be accomplished by assigning a dedicated phase-locked loop (PLL) 1 for each resonance (FIG. 1). For the highest precision, the PLL gain parameters are set such that the resonator (1)-PLL(2) system (in closed-loop) has a desired response to changes in resonant frequency—for example, parameters for a Butterworth-type response are given in Table 1. This approach can be used to achieve an arbitrary transfer function (Chebyshev, elliptical, Bessel, etc) at a desired order and bandwidth or any transfer function with the desired shape and bandwidth. In general it may be desirable to set the transfer function of the PLL to be relatively flat up to a desired frequency, and rapid roll-off between successive frequencies of interest, ie other resonator frequencies or other mode frequencies. However other transfer functions may be of interest as well.

TABLE 1

Optimal PLL parameters for n$^{th}$ order Butterworth-type response with bandwidth, β.

| n | $k_p$ | $k_i$ | $\tau_1$ | $\tau_2$ |
|---|---|---|---|---|
| 1 | β | $k_p/\tau$ | | |
| 2 | β/√2 | $k_p/\tau$ | √2/2β | |
| 3 | β/2 | $k_p/\tau$ | $(1 \pm j)/2\beta$ | $(1 \mp j)/2\beta$ |

Figure 2:
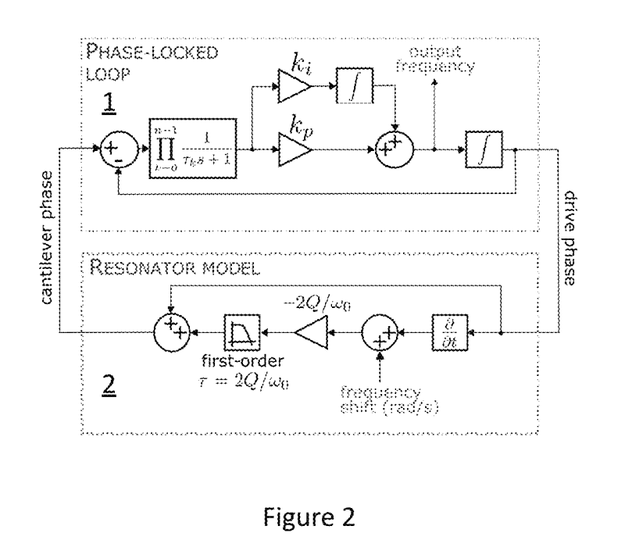
FIG. 2 shows a linear phase model of a PLL and resonator according to an illustrative embodiment.

For engineering the closed loop transfer function, the phase-domain transfer function of a harmonic oscillator around its resonant frequency is derived and used to calculate the transfer function of a generic resonator-PLL system (FIG. 2). Then, the PLL parameters (Table 1) are calculated that simplify the resonator-PLL system to a Butterworth filter with desired bandwidth, β and order, n. The required PLL parameters for a desired order and bandwidth depend on the time constant, τ (a function of frequency and quality factor) of the corresponding resonance and the desired measurement bandwidth.

Figure 3:
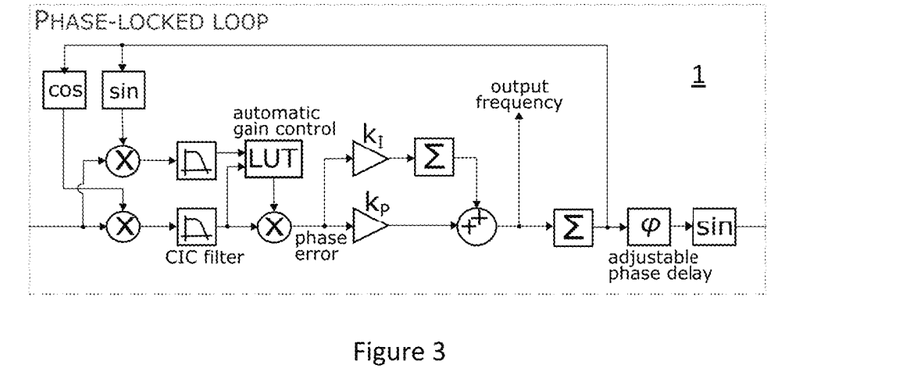
FIG. 3 is a block diagram of digital implementation of a PLL according to an illustrative embodiment.

A desirable aspect of the technique is scalability. Analog PLL systems are generally not easily scaled, but an exemplary PLL may be digitally implemented on a field-programmable gate array (FPGA) (FIG. 3). Thus up to N PLLs may be implemented with similar effort as implementing one PLL, where N depends on the number of logic elements and other resources of the FPGA. In two exemplary implementations, an Altera Cyclone IV FPGA and an Altera Stratix IV FPGA were used, yielding N=12 and N=62, respectively. Larger FPGAs may allow for simultaneous measurement of hundreds of resonators.

An illustrative PLL element may be implemented including a phase-error detector, implemented as a multiplier followed by a second-order cascaded integrator-comb (CIC) low-pass filter with variable rate change factor. CIC filters are very efficient to represent in digital logic, and thus help ensure that many PLLs can fit on a single FPGA. The CIC output is normalized relative to the input signal magnitude (calculated onboard in a manner analogous to a lock-in amplifier) such that it represents only the phase error and not the amplitude of the input signal. This phase error signal may then be passed through a configurable set of second order section (SOS) biquad filters and then used both for proportional and integral control of the frequency of a numerically controlled oscillator (NCO). The NCO output is then shifted by an arbitrary phase before being passed to the drive electronics. This phase shift may be chosen to maximize the oscillation amplitude of the resonator, or minimize the noise present in the loop. The output can also be arbitrarily rescaled to drive the resonator at chosen amplitude.

The PLL parameters (CIC filter rate, SOS filter parameters, proportional gain, integral gain, phase shift, drive amplitude) are not necessarily hardcoded into the FPGA code, but also can be both read and written by an on-FPGA CPU (implemented here as the NIOS II processor from Altera). In this embodiment, a CPU opens a socket for Ethernet-based communication with a PC, or other computing device, where the data can be stored and analyzed. The PC also can request that the on-FPGA CPU change these control parameters on the fly.

Communication between the FPGA and the PC may be over Ethernet, via TCP (setting parameter values) and UDP (the PC receiving frequency data from the FPGA). In this example over 100,000 32-bit frequency values per second may be sent without any lost data, and further compression of the frequency data via schemes like delta encoding could increase this bandwidth.

Because the PC can control the PLL parameters, the entire setup process can be easily automated such that a resonator system's transfer function is measured, resonances are detected and Qs are calculated, and then the PLL parameters are automatically set to obtain any arbitrary transfer function for each resonator (for example, one might desire that all resonators behave identically, with flat frequency responses up to a fixed bandwidth).

Analog-to-digital and digital-to-analog conversion is done at 100 MHz with 14-bit convertors in this example. The exemplary system is theoretically applicable for resonances up to 50 MHz, but practically probably below 25 MHz. The only requirements are that the resonator signal can be converted to an electrical signal (by any of a variety of means including optical levers, piezoresistors, or capacitive sensors), and that the electrical drive signal from the FPGA can be converted to a driving force on the resonator (by any of a variety of means including piezoelectric, electrostatic, thermal, magnetic actuation).

The exemplary control system was tested in two ways: first using a suspended nanochannel resonator (SNR) in multiple modes simultaneously, and second in an array of 12 suspended microchannel resonators (SMRs) on a single chip. SNRs are high-quality-factor cantilevers with integrated fluidic channels that have been previously utilized to weigh nanoparticles. Different from the mass sensors operating by adsorption, SNRs weigh flowing particles in solution. Each particle generates a frequency modulation signal, which is a function of particle buoyant mass and flow path in the SNR. Therefore, monitoring position and mass of nanoparticles in real-time in an SNR may require not only oscillating multiple modes simultaneously, but also doing so with wide bandwidth and high precision.

Figure 4:
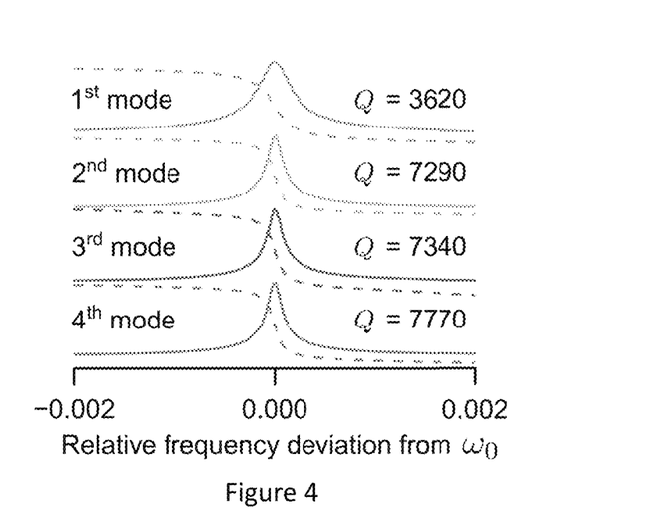
FIG. 4 shows the amplitude and phase of the first four resonances of an SMR according to an illustrative embodiment.
Figure 5:
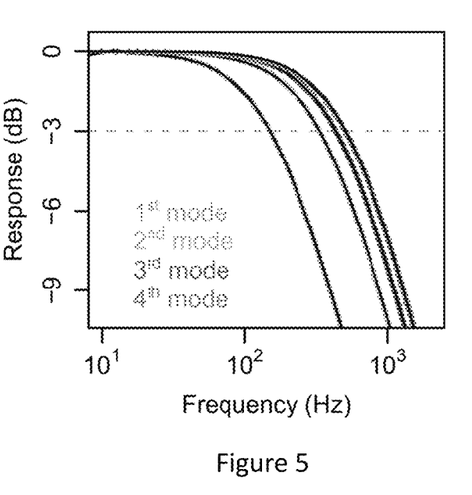
FIG. 5 shows the expected and measured closed loop response of the first four modes according to an illustrative embodiment.
Figure 6:
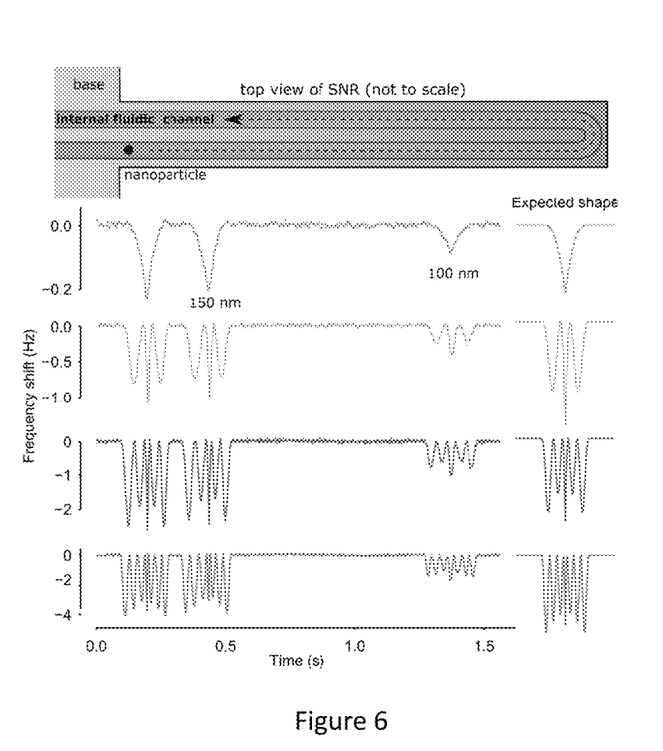
FIG. 6 shows an SMR layout and parts of measured frequency waveforms according to an illustrative embodiment.

The exemplary digital control system was tested with an SNR in feedback with four PLLs simultaneously. The lowest four mode frequencies were measured and corresponding Q-factors (FIG. 4) for calculating the PLL parameters (Table 1) to achieve the desired first-order transfer functions (FIG. 5). Then 100 and 150 nm gold nanoparticles are flowed through the SNR, while recording the mode oscillation frequencies (FIG. 6). The signals observed from nanoparticles transiting the SNR match exceedingly well with those predicted by theory, indicating that the exemplary PLL array provides high-bandwidth, low-noise, and low-distortion measurements of the resonant frequencies of each mode. Since the presented system is highly scalable, this same approach can be applied for any system with multiple resonances at different frequencies.

Figure 7:
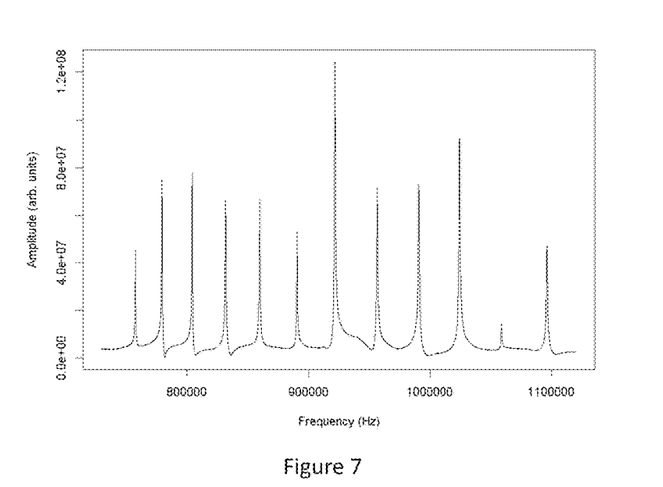
FIG. 7 is an illustration of spaced resonant frequencies for an array of suspended fluid channel resonators according to an illustrative embodiment.
Figure 8A:
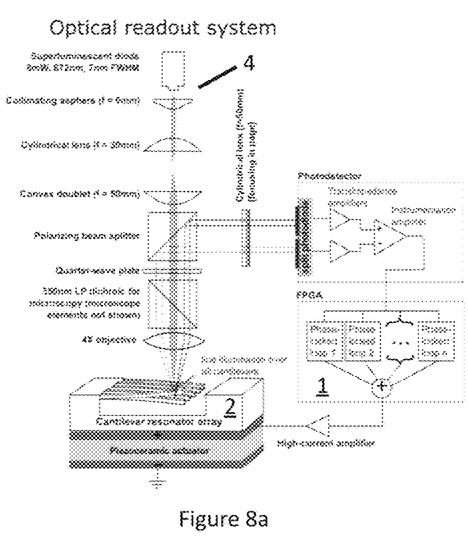
FIGS. 8a and 8b show example optical and piezoresistive setups for operating many cantilevers according to an illustrative embodiment.
Figure 8B:
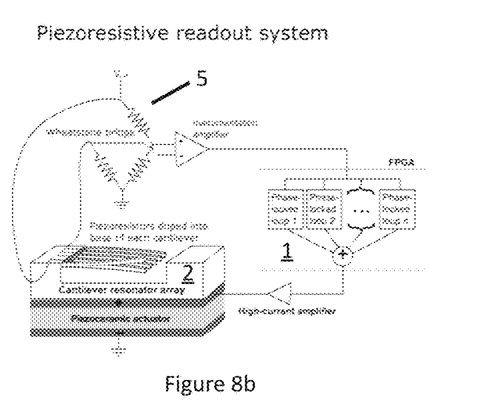
Figure 9:
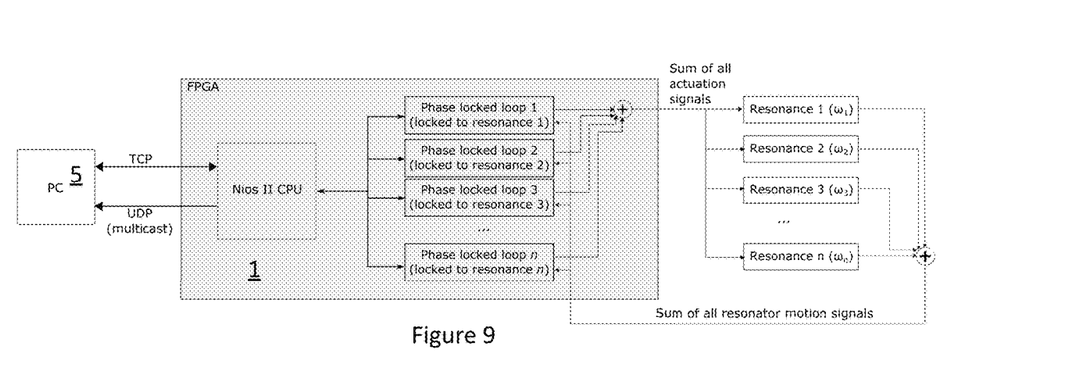
FIG. 9 shows a schematic of an exemplary system implemented FPGAs according to an illustrative embodiment.

A second test of the exemplary control system was operating an array of resonators with different resonant frequencies (FIG. 7). The resonators are configured such that a single actuator (here, a single piezoceramic placed underneath the chip) is used to oscillate all of the resonators, and a single detector (in this embodiment, a photodetector 4) receives the superposition of all of the resonators' positions (FIG. 8a). The resonators fluid channels may be configured in any desired pattern (serial, parallel, etc), but here were connected serially. In the test discussed here, the 12 cantilevers were fluidically connected in parallel, but simultaneously measured and oscillated in parallel. FIG. 9 therefore shows the frequency response of all 12 cantilevers, in which a series of cells and particles sequentially flows through each cantilever, one after another. As shown in FIG. 8b, in some embodiments a piezoresistive motion readout system may be employed as the readout mechanism.

In both 8a and 8b, the position signals from all resonators are combined into a single physical (voltage) signal. In the exemplary embodiment shown in 8a, a single light source (4) is used to illuminate all resonators in an array (here arrayed side-by-side) simultaneously. The reflected light is diverted towards a single photodetector, which measures effectively the superposition of all resonator position signals. Similarly, in the exemplary embodiment shown in 8b, many resonator piezoresistors are initially combined in series (as shown) or in parallel, or any arrangement in which their total resistance is approximately a linear combination of all the individual resonator piezoresistor resistances. This combined resistance is used as one edge of a wheatstone bridge (5) and then amplified, yielding a signal analogous to the optical signal in FIG. 8b—that is, a superposition of all the resonators' position signals. The array of PLLs on the FPGA then demodulate each resonator's frequency signal individually (as they are all at different frequencies), and each PLL generates a sinusoidal drive signal at the resonance frequency of its corresponding resonance. The PLL outputs are collectively summed on the FPGA, and then used to drive a single actuator, in this embodiment, a piezoceramic, but might also include electrostatic or optical excitation methods.

The resonators described herein and in the incorporated references may be designed for measurements of individual particles or other objects that may be difficult to measure with conventional instrumentation. Thus the resonators are generally small enough that they are made with MicroElectronic Mechanical Systems (MEMS) microfabriction techniques. Mechanical resonators suitable for embodiments described herein fall into classes of dimensions suitable for the type targeted particle masses detectable: Exemplary classes include devices at large, medium, and small scales, and all three of these classes may be used in cantilever arrays and/or for multiple-mode operation.

Large (LSMR):
a. cantilever cross section typically around 19×57 um, internal channels are 15×20 um.
b. typical lengths of 200-500 μm.
c. Detectable mass—on the order of 0.1 pg or so, but typically we use these to measure yeast or mammalian cells, with buoyant masses from 5-500 pg.

Medium (mSMR):
a. cantilever cross section typically around 4×19 um, internal channels are 3×5 um.
b. typical lengths of 100-400 um.
c. Detectable mass—on the order of 0.2 fg or so, typically used to detect bacteria with buoyant masses from 0.5 fg to 500 fg.

Small (suspended nanochannel resonator or SNR):
a. cantilever cross section typically around 1×5 um, internal channels are 0.4×1 um.
b. typical lengths of 20-200 um.
c. Minimum detectable mass—on the order of 5-10 ag. Used to detect nanoparticles (viruses, DNA origami, protein aggregates, liposomes, etc).

As can be seen the dimensions cover the range from 1- to 1000 microns in length and from 1 to 100 microns in cross section. These sizes, implemented in silicon and/or other microfabricatable materials lead to resonant frequencies in the 10's of kilohertz up to 10's of megahertz range. Improvements in microfabrication techniques may provide for even smaller and more sensitive measurements operating at higher resonant frequencies, but improvements in electronics will also allow for faster PLL operation. Thus the techniques disclosed herein are not intended to be limiting by the current performance metrics, but the exemplary classes show that the application include measurements not easily performed or in many cases not possible with other analytic techniques.

The techniques disclosed herein, as mentioned above, are suitable to arrays of resonators as well as single resonators, and may be desirable for the case where the arrays of resonators are operated with some combination of common excitation and/or signal detection. As shown in FIG. 7, the individual resonators in an array may be fabricated with different lengths or cross-sections, yielding a different resonant frequency for each resonator. FIG. 7 shows the transfer function for the sum of all the resonators in a 12-cantilever array, in which cantilevers range from 350 to 450 um long. For this arrangement, it may be convenient as shown in FIGS. 8a and 8b to excite the array with a common actuator 2 as shown, and observe the movement of the resonators with a common detector, 4 or 5. In this arrangement, the excitation and detector signals may be in feedback with individual PLL's 1 as shown in FIG. 9, each with a transfer function with center frequency and pass band tailored to the resonant frequency of each resonator in the array. If the spacing of the resonant frequencies is chosen wide enough to accommodate the change in resonant frequency due to the transit of masses of interest in each resonator, then the system can ensure that every resonator is always vibrating at its resonant frequency, even if that resonant frequency is rapidly changing (e.g. a particle passing through a the channel on the resonator).

Some examples of resonator array systems would be measurement bandwidth goals: on the order of 100-1000 Hz per resonator, so spacing on the order of at least 2 kHz, with conservative current designs are on the order of 30 kHz as shown in FIG. 7.

Target resonator numbers: example designs with up to 12 cantilevers on a single chip have been tested, and designs with 40 cantilevers on a chip have been fabricated. 100 plus cantilevers are possible with current fabrication and FPGA implemented PLL control.

Figure 10A:
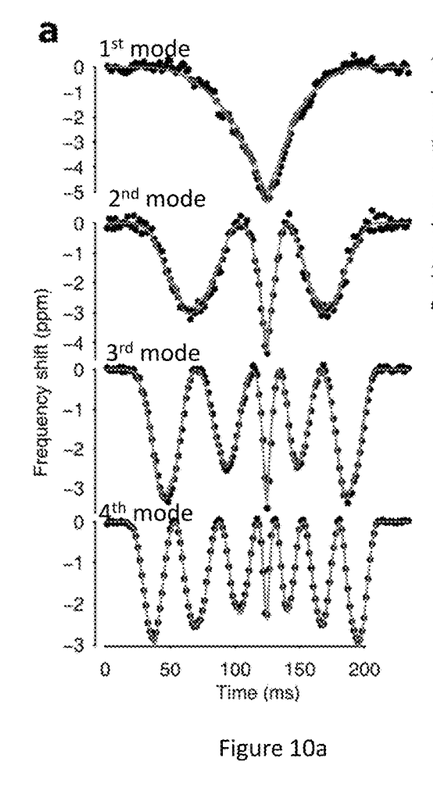
FIGS. 10a and 10b show frequency and position signals in four modes from a single 150 nm gold nanoparticle transiting an SMR according to an illustrative embodiment.
Figure 10B:
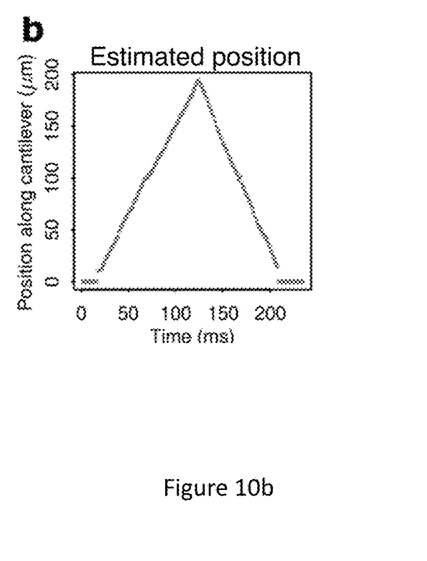

Using the frequency signal from multiple resonator modes measured simultaneously, one can estimate the position of point masses flowing through the resonator. FIG. 10a shows the resonant frequency signals for the first four bending modes of a 200-microns-long suspended nanochannel resonator, as a single 150 nm gold nanoparticle flowed through the resonator. FIG. 10b demonstrates the ability to use this frequency information to estimate the particle position (here the particle flows to the tip of the cantilever and then back to the base of the cantilever).

Figure 11A:
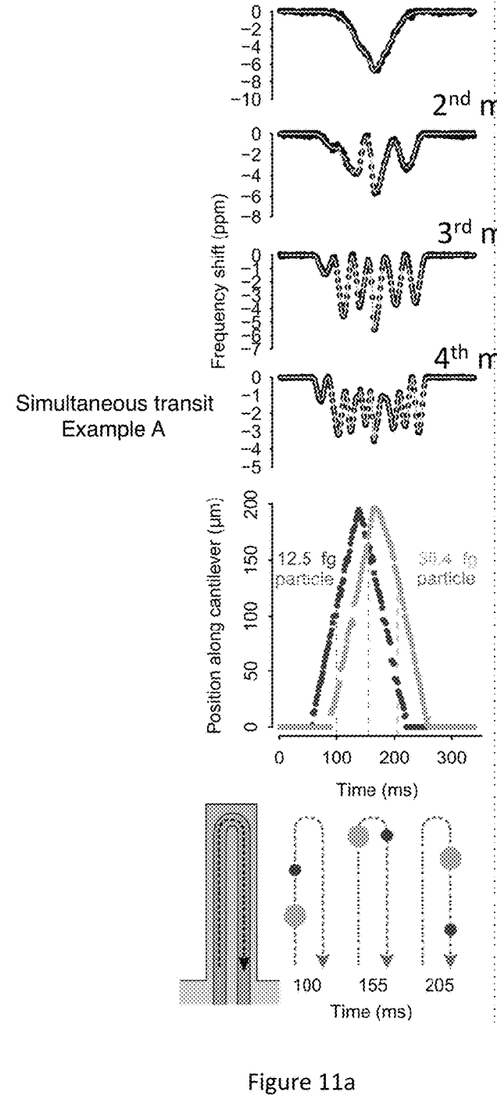
FIGS. 11a and 11b show frequency and position signals in four modes two nanoparticles transiting an SMR according to an illustrative embodiment.
Figure 11B:
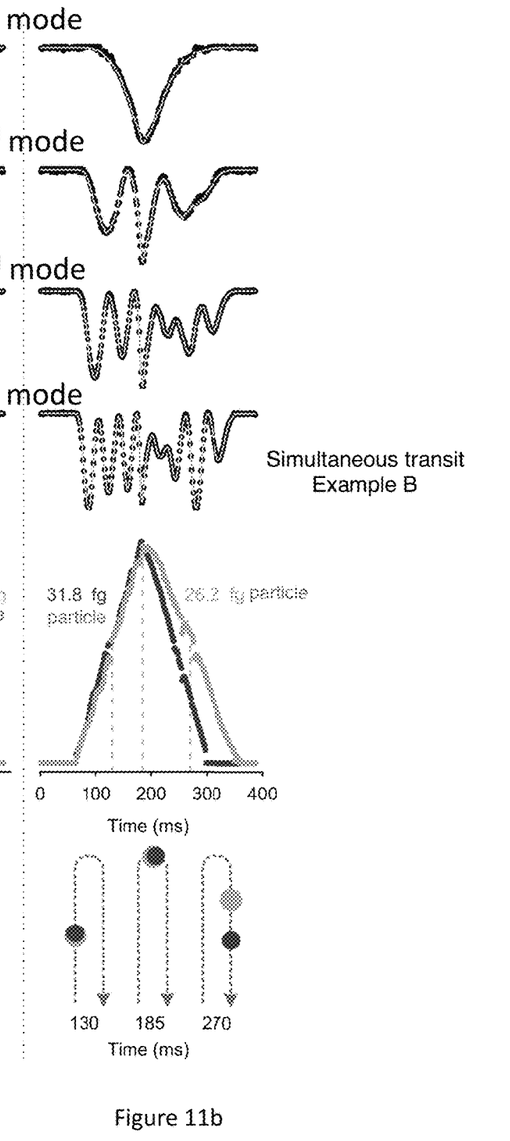

FIGS. 11a and 11b demonstrates that using multiple modes, even if there are multiple point masses loading the resonator simultaneously, they can be resolved using multiple modes. Examples A (11a) and B (11b) are two separate instances in which two nanoparticles nearly simultaneously transit the SNR nanochannel, yet their positions and masses can be precisely estimated (middle panels, and shown schematically in bottom panels).

Figure 12:
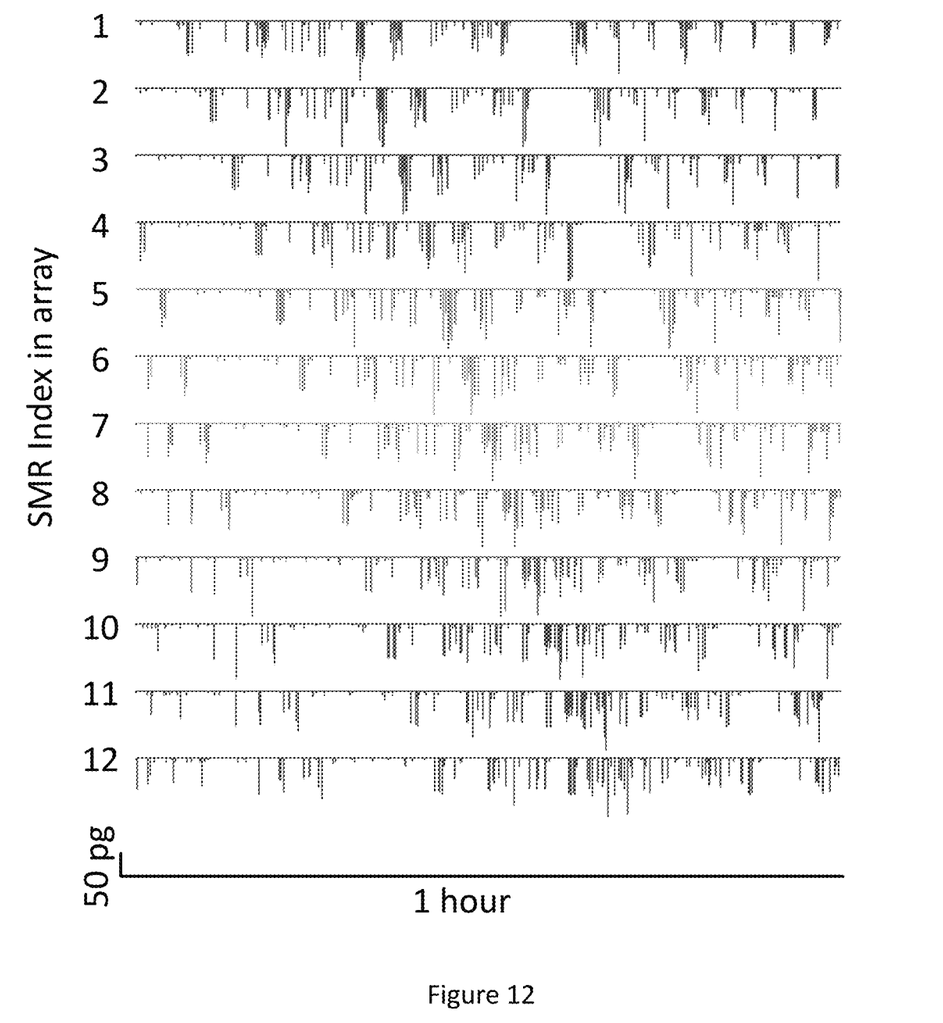
FIG. 12 shows frequency signals measured from a 12-cantilever SMR array according to an illustrative embodiment.

FIG. 12 demonstrates the ability of the PLL array to simultaneously acquire resonant frequency data from 12 SMRs arrayed on a single chip. Frequency signals are shown after conversion from frequency (Hz) to mass (pg, 1 picogram=$10^{-12}$ g) such that they are directly comparable from each resonator. Each downward spike is a single cell transiting an SMR in the array. In the array employed here, the SMRs are fluidically connected in series, therefore each subsequent SMR measures nearly the same signal as the previous SMR, but at a slightly later point in time.

Figure 13:
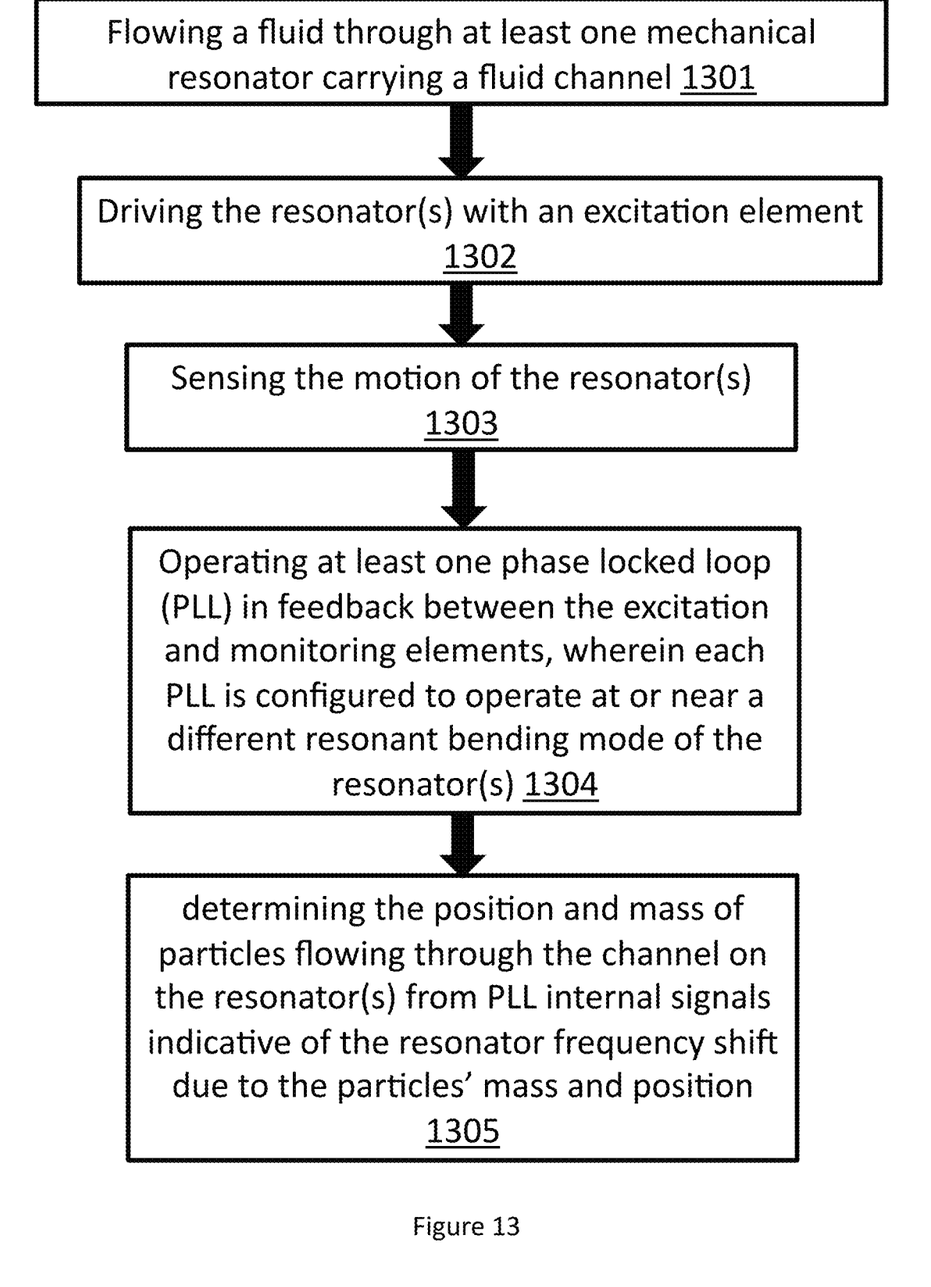
FIG. 13 is flow chart of an illustrative method.

FIG. 13 is a flowchart of a method embodiment. Step 1301 includes flowing a fluid through at least one mechanical resonator carrying a fluid channel, Step 1302 includes driving the resonator(s) with an excitation element, Step 1303 includes sensing the motion of the resonator(s), Step 1304 includes operating at least one phase locked loop (PLL) in feedback between the excitation and monitoring elements, wherein each PLL may be configured to operate at or near a different resonant bending mode of the resonator(s), and Step 1305 includes determining the position and mass of particles flowing through the channel on the resonator(s) from PLL internal signals indicative of the resonator frequency shift due to the particles' mass and position.

Figure 14A:
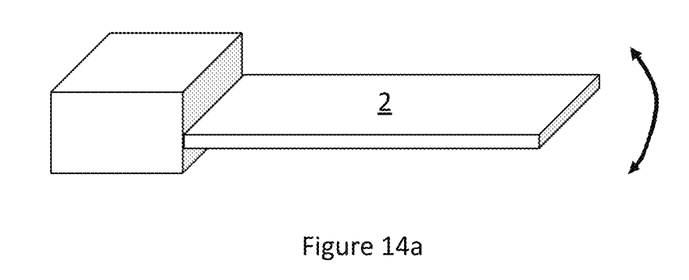
FIGS. 14a, 14b and 14c depict various suspended resonator characteristics.
Figure 14B:
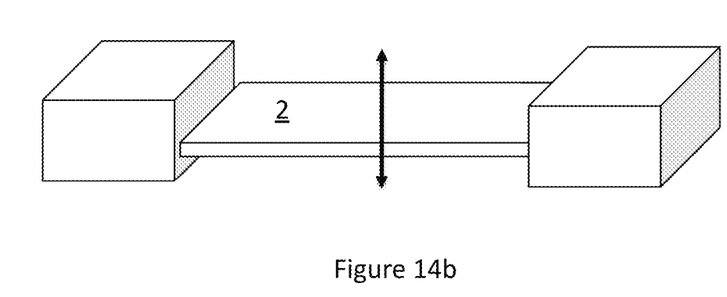
Figure 14C:
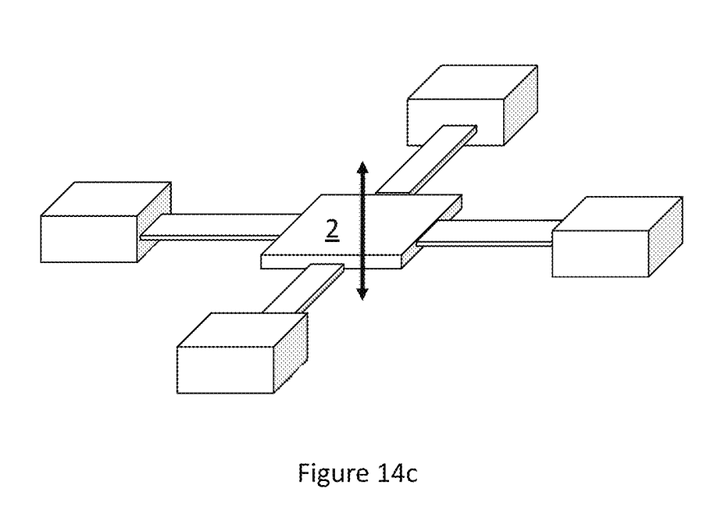

Although the illustrative embodiments thus far described have referred to suspended resonators carrying a fluid channel, the techniques disclosed are applicable to any mechanical resonator with suitable drive and motion sensing elements. Suspended resonators, particularly arrays of such resonators, may benefit from these control techniques. As shown in FIG. 14a, suspended resonators 2 may take the form of a cantilever with a fixed and a free end as already described, or may take the form of a suspended membrane resonator, 2, suspended at two, FIG. 14b, or more, FIG. 14c, attachment regions. Such suspended resonators may carry fluid channels as described above or may be solid and/or have non-fluid channel sample holders, adsorption sites, traps, or other means of carrying a substance of interest. Substances carried by these resonators, including particles flowing in fluid channels for suitable resonators, adsorbed particles or others, will affect the resonant behavior of the resonator.

Measuring the resonant shift due to the presence of carried substances may provide information about the properties of the carried substances. Mass and position information about carried substances is one example. Other effect may affect the resonant behavior of resonators.

Depending on their configuration, resonators may be sensitive to forces, electrical and magnetic fields, temperature changes and other effects, any of which may cause a resonant shift for suitably configured resonators. The control techniques described herein may benefit any measurement of the behavior of a resonator due to effects that cause a resonant shift.

The embodiments described herein are exemplary. Modifications, rearrangements, substitute processes, etc. may be made to these embodiments and still be encompassed within the teachings set forth herein. One or more of the steps, processes, or methods described herein may be carried out by one or more processing and/or digital devices, suitably programmed.

Depending on the embodiment, certain acts, events, or functions of any of the embodiments described herein can be performed in a different sequence, can be added, merged, or left out altogether (e.g., not all described acts or events are necessary for the practice of the embodiment). Moreover, in certain embodiments, acts or events can be performed concurrently, e.g., through multi-threaded processing, interrupt processing, or multiple processors or processor cores or on other parallel architectures, rather than sequentially.

The various illustrative logical blocks, modules, analog electronics and method steps described in connection with the embodiments disclosed herein can be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described in connection with the embodiments disclosed herein can be implemented or performed by a machine, such as a processor configured with specific instructions, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration. For example, functions allocated to device identified as "PC" may be implemented using a discrete memory chip, a portion of memory in a microprocessor, flash, EPROM, or other types of memory, or computing device.

The elements of a method, process, or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of computer-readable storage medium known in the art. An exemplary storage medium can be coupled to the processor such that the processor can read information from, and write information to, the storage medium. In the alternative, the storage medium can be integral to the processor. The processor and the storage medium can reside in an ASIC. A software module can comprise computer-executable instructions which cause a hardware processor to execute the computer-executable instructions.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," "involving," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Disjunctive language such as the phrase "at least one of X, Y or Z," unless specifically stated otherwise, is otherwise understood with the context as used in general to present that an item, term, etc., may be either X, Y or Z, or any combination thereof (e.g., X, Y and/or Z). Thus, such disjunctive language is not generally intended to, and should not, imply that certain embodiments require at least one of X, at least one of Y or at least one of Z to each be present.

The terms "about" or "approximate" and the like are synonymous and are used to indicate that the value modified by the term has an understood range associated with it, where the range can be ±20%, ±15%, ±10%, ±5%, or ±1%. The term "substantially" is used to indicate that a result (e.g., measurement value) is close to a targeted value, where close can mean, for example, the result is within 80% of the value, within 90% of the value, within 95% of the value, or within 99% of the value.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While the above detailed description has shown, described, and pointed out novel features as applied to illustrative embodiments, it will be understood that various omissions, substitutions, and changes in the form and details of the devices or algorithms illustrated can be made without departing from the spirit of the disclosure. As will be recognized, certain embodiments described herein can be embodied within a form that does not provide all of the features and benefits set forth herein, as some features can be used or practiced separately from others. All changes which come within the meaning and range of equivalency of the claims are to be embraced within their scope.

The following references are incorporated by reference in their entirety:
1. Lee J, Chunara R, Shen W, Payer K, Babcock K, Burg T P, Manalis S R. (2011). Suspended microchannel resonators with piezoresistive sensors. Lab on a Chip, 11(4): 645-51.
2. Lee J, Bryan A K, Manalis S R. (2011). High precision particle mass sensing using microchannel resonators in the second vibration mode. Review of Scientific Instruments, 82(2).
3. Bryan A K, Hecht V C, Shen W, Payer K, Grover W H, Manalis S R. (2014). Measuring single cell mass, volume, and density with dual suspended microchannel resonators. Lab on a Chip, 14(3): 569-76.
4. Burg T P, Godin M, Knudsen S M, Shen W, Carlson G, Foster J S, Babcock K, Manalis S R. (2007). Weighing of biomolecules, single cells and single nanoparticles in fluid. Nature, 446(7139): 1066-9.
5. Olcum S, Cermak N, Wasserman S C, Manalis S R. (2015). High-speed multiple-mode mass-sensing resolves dynamic nanoscale mass distributions. Nature communications, 6.

The invention claimed is:

1. A measurement system comprising:
one or more suspended microchannel resonators, each resonator comprising a fluid channel for flowing a carried substance therethrough;
an excitation element for driving the one or more resonators;
a sensor for monitoring motion of the one or more resonators;
at least one phase locked loop (PLL) in feedback between the excitation element and the sensor, wherein the PLL is configured to operate at or near a resonant mode of the one or more resonators; and
a processor for determining information from PLL internal signals indicative of a resonator frequency shift
wherein the system is configured to determine one or more properties of the carried substance on the one or more resonators by measuring the resonator frequency shift due to the presence of the carried substance as the carried substance flows through the fluidic channel on the one or more resonators, and
wherein the transfer function of the PLL is configurable for shape and bandwidth.

2. The system of claim 1, further comprising fluidic control elements for flowing liquid and a cell through the fluid channel, wherein the carried substance is the cell.

3. The system of claim 2, wherein the information determined from the resonant frequency shift includes a growth rate of the cell.

4. The system of claim 1, wherein the processor determines a 1-dimensional mass distribution from a resonant frequency shift due the presence of the carried substance carried through the fluid channel on the resonator.

5. The system of claim 1, wherein an array of resonators are operated together.

6. The system of claim 5, wherein the array size is 10 or more resonators.

7. The system of claim 5, wherein the resonant frequencies of the resonators are separated by at least 2 kHz.

8. The system of claim 5, wherein the resonator frequency is between 30 kHz and 10 MHz.

9. The system of claim 5, wherein the resonator dimensions range from 10 microns to 1000 microns in length and from 1 to 100 microns in cross section.

10. A method, the method comprising:
driving one or more resonators with an excitation element, each resonator comprising a fluid channel therethrough;
sensing motion of the one or more resonators with a sensor;
operating a phase locked loop (PLL), in feedback between the excitation element and the sensor, at or near a resonant mode of the resonator;
reading, by a processor, PLL internal signals indicative of a resonator frequency shift;
configuring a transfer function of the PLL for shape and bandwidth; and
determining a property of a carried substance from the resonator frequency shift due to the carried substance flowing in a liquid through the fluid channel of the resonator.

11. The method of claim 10, wherein the determined property of the carried substance includes mass or a growth rate of the carried substance.

12. The method of claim 11, wherein the carried substance is a mammalian cell.

13. The method of claim 10, including determining a 1-dimensional mass distribution from a resonant shift due the presence of at least the carried substance on the resonator.

14. The method of claim 10, wherein an array of resonators are operated together.

15. The method of claim 14, wherein the array size is 10 or more resonators.

16. The method of claim 14, wherein the resonant frequencies of the resonators are separated by at least 2 kHz.

17. The method of claim 14, wherein the resonator frequency is between 30 kHz and 10 MHz.

18. The method of claim 14, wherein the resonator dimensions range from 10 microns to 1000 microns in length and from 1 to 100 microns in cross section.

19. The system of claim 1, wherein the PLL's are implemented in digital logic.

20. The system of claim 1, wherein the PLL's are implemented on a Field Programmable Gate Array (FPGA).

* * * * *

UNITED STATES PATENT AND TRADEMARK OFFICE
CERTIFICATE OF CORRECTION

PATENT NO. : 11,143,548 B2
APPLICATION NO. : 15/523033
DATED : October 12, 2021
INVENTOR(S) : Nathan Cermak et al.

It is certified that error appears in the above-identified patent and that said Letters Patent is hereby corrected as shown below:

In the Specification

At Column 1, Lines 26-33, please delete the paragraph as follows:
"This invention was made with Government support under Grant No. OCE-1129359 awarded by the National Science Foundation, under Grant No. P30 CA014051 awarded by the National Institutes of Health, under Grant No. W81XWH-09-2-0001-218193 awarded by the U.S. Army Medical Research and Material Command, and under Contract No. W911NF-09-D-0001 awarded by the Army Research Office. The Government has certain rights in the invention."

And insert the following updated paragraph to read as follows:
--This invention was made with Government support under Grant No.(s) P30 CA014051 awarded by The National Institute of Health (NIH), OCE1129359 awarded by The National Science Foundation (NSF), W911NF-09-D-0001 awarded by the Army Research Office, and W81XWH-09-2-0001 awarded by the Army Medical Research and Material Command. The Government has certain rights in the invention.--

Signed and Sealed this
Eighteenth Day of January, 2022

Drew Hirshfeld
*Performing the Functions and Duties of the*
*Under Secretary of Commerce for Intellectual Property and*
*Director of the United States Patent and Trademark Office*